United States Patent
Rappoport

(10) Patent No.: US 6,614,430 B1
(45) Date of Patent: Sep. 2, 2003

(54) SYSTEM AND METHOD FOR THE EXCHANGE OF CAD DATA

(75) Inventor: Ari Rappoport, Jerusalem (IL)

(73) Assignee: Proficiency Ltd., Jerusalem (IL)

( * ) Notice: Subject to any disclaimer, the term of this patent is extended or adjusted under 35 U.S.C. 154(b) by 0 days.

(21) Appl. No.: 09/391,311

(22) Filed: Sep. 7, 1999

Related U.S. Application Data

(60) Provisional application No. 60/099,340, filed on Sep. 8, 1998.

(51) Int. Cl.[7] .............................................. G06T 15/00
(52) U.S. Cl. ....................................................... 345/420
(58) Field of Search ................................ 345/419, 420, 345/421, 619

(56) References Cited

U.S. PATENT DOCUMENTS

| | | | |
|---|---|---|---|
| 5,386,500 A * | 1/1995 | Pomerantz et al. | 345/419 |
| 5,646,862 A | 7/1997 | Jolliffe et al. | 364/488 |
| 5,717,905 A | 2/1998 | Iwamoto et al. | 395/500 |
| 5,815,415 A | 9/1998 | Bentley et al. | 364/578 |
| 5,870,588 A | 2/1999 | Rompaey et al. | 395/500 |
| 5,945,995 A | 8/1999 | Higuchi et al. | 345/420 |
| 6,128,023 A * | 10/2000 | Kawashima | 345/619 |
| 6,501,822 B2 * | 12/2002 | Roder | 378/22 |

FOREIGN PATENT DOCUMENTS

| | | |
|---|---|---|
| EP | 0 355 167 A1 | 2/1990 |
| WO | WO 99/44107 | 9/1999 |
| WO | WO 02/37406 a1 | 5/2002 |

OTHER PUBLICATIONS

Hoffman, Christoph M. and Robert Joan–Arinyo, *On user–defined features*, Computer–Aided Design, vol. 30 No. 5. 1998, pp. 321–332.

Hoffman, Christoph M. and Robert Joan–Arinyo, *CAD and the Product Master Model*, Oct. 7, 1997, pp. 1–32.

Hoffman, Christoph M. and Xiangping Chen, *On editability of feature–based design*, Computer–Aided Design, vol. 27, No. 12, 1995, pp. 905–914.

Hoffman, Christoph M. and Xiangping Chen, *Towards feature attachment*, Computer–Aided Design, vol. 27 No. 9, 1995, pp. 695–702.

Hoffman, Christoph M., Xiangping Chen, and Vasilis Capoyleas, *Generic naming in generative, constraint–based design*, Computer–Aided Design, vol. 28 No. 1, 1996, pp. 17–26.

Buoma, William, Loannis Fudos, Christoph Hoffman, Jiazhen Cai, and Robert Paige, *Geometric constraint solver*, Computer–Aided Design, vol. 27 No. 6, 1995, pp. 487–501.

Hoffman, Christoph, and Robert Juan, *Erep☐ An Editable, High–Level Representation for Geometric Design and Analysis*, Geometric Modeling for Product Realization, 1993, pp. 129–164.

Hel–Or, Yaacov, Ari Rappoport, and Michael Werman, *Relaxed Parametric Design with Probabilistic Constrints*, 2nd ACM Solid Modeling, 1993, pp. 261–280.

*Engen Final Report*, Nov. 25, 1998, Cooperative Agreement No. N00014–95–2–0013.

(List continued on next page.)

*Primary Examiner*—Phu K. Nguyen
(74) *Attorney, Agent, or Firm*—Fish & Richardson P.C.

(57) ABSTRACT

A method and apparatus for mechanical data exchange between parametric computer aided design systems ("CAD"). According to an embodiment, computer-implemented methods, techniques and structures are employed to extract parametric specification data from a source CAD file and create a second parametric-based CAD file for a different CAD system. In one embodiment, an intermediate data structure is utilized. An objective is creation of a second parametric-based CAD file that preserves design intent of the parametric-based source CAD file.

23 Claims, 3 Drawing Sheets

OTHER PUBLICATIONS

Solano, Lluis, and Peter Brunet, *A System for Constructive Constraint–Based Modeling, Modeling in Computer Graphics Methods and Applications*, 1993, pp. 61–83.

Rappoport, Ari, *A Scheme for Single Instance Representation in Hierarchical Assembly Graphs, Modeling in Computer Graphics*, 1993, pp. 213–224.

Kripic, Jiri, *A Mechanism for Persistently Naming Topological Entities in History–based Parametric Solid Models, Solid Modeling*, 1995, pp. 21–30.

Lequette, Remi, *Considerations on Topological Naming, Product Modeling for Computer Integrated Design and Manufacture*, 1997, pp. 394–403.

Bidarra, R. et al., "Representation and management of feature information in a cellular model," Computer Aided Design, Elsevier Publishers BV, Barking G.B. vol. 30, No. 4, Apr. 1, 1998, pp. 301–313.

Hoffman, C.M. et al., "CAD and the product master model" Computer Aided Design, Elsevier Publishers BV. Barking, GB, vol. 30, No. 11, Sep. 15, 1998, pp. 905–918.

de Kraker, K. J. et al., "Multiple–way feature conversion to support concurrent engineering" Proceedings of the Third Symposium on Solid Modeling and Applications. Salt Lake City, May 17–19, 1995 Proceedings of the Symposium on Solid Modeling and Applications, New York, ACM, US, vol. SYMP. 3, May 17, 1995, pp. 105–114.

Middleditch et al. "A representation independent geometric modeling kernel" Geometric Modeling and Processing 2000. Theory and Applications. Proceedings Hong Kong, China Apr. 10–12, 2000. Los Alamitos, CA USA, IEEE Comput. Soc, US, Apr. 10 2000, pp. 79–89.

Ragothama S. et al., "Consistent updates in dual representation systems" Computer Aided Design, Elsevier Publishers BV. Barking, GB, vol. 32, No. 8–9, Aug. 2000, pp. 463–477.

Shah, J.J. et al., "Experimental investigation of the STEP form–feature information model" Computer Aided Design, Elsevier Publishers BV. Barking, GB, vol. 23, No. 4, May 1, 1991, pp. 282–296.

Han and Requicha, *Modeler–independent feature recognition in a distributed environment, Computer–Aided Design*, GB, Elsevier Science Ltd. Publishers BV, vol. 30, No. 6, pp 453–463 (May 1, 1998).

Kao and Lin, *Development of a collaborative CAD/CAM system, Robotics and Computer Integrated Manufacturing*, GB, Elsevier Science Ltd. Publishers, BV, vol. 14, No. 1, p. 55–68 (Feb. 1, 1998).

Foley, James D., Andries van Dam, Steven K. Feiner, John F. Hughes. *Computer Graphics, Principles and Practice*. 2nd ed. *Addison Wesley*, 2000. pp xvii–xxiii, 1153–1173.

Murray, James D. and William vanRyper. *Graphics File Formats*. 2nd ed. *O'Reilly & Associates, Inc.*, 1996. pp v–xiii, 1099–1116.

Bloor, M. Susan and Jon Owen. *Product Data Exchange. UCL Press:London*, 1995. pp v–xii, 211–214, 259–262.

Shah, Jami J. and Martti Mantyla. *Parametric and Feature-–based CAD/CAM. John Wiley & Sons, Inc.*, 1995. xi–xx, 1, 593–619.

Petzold, Charles. *Programming Windows*. 5th ed. *Microsoft Press*, 1999. Contents: 15 pages unnumbered, pp 1437–1479.

Strasser, W., R. Klein, R. Rau, Eds. *Geometric Modeling: Theory and Practice. Springer:Berlin*, 1997. pp vii–ix.

"Method For Cataloging Elements In A Computer Aided Desing" IBM Technical Disclosure Bulletin, US, IBM Corp. New York, vol. 36, No. 5, May 1, 1993 pp. 409–410, XP000409039 ISSN: 0018-8689.

Dadam P. et al., "Datenbanksysteme Als Werkzeug Zur Integration Von Cax–Systemen" Automatisierungstechnische Praxis—ATP, DE, Oldenbourg Verlag. Munchen, vol. 31 No. 9, Sep. 1, 1989, pp. 431–438 XP000066116 ISSN:0178-2320.

* cited by examiner

SYSTEM AND METHOD FOR THE EXCHANGE OF CAD DATA

PRIORITY INFORMATION

This application claims priority from a U.S. provisional application Ser. No. 60/099,340, filed Sep. 8, 1998, and hereby incorporated by reference.

FIELD OF THE INVENTION

The invention relates generally to computer-aided design and more specifically to transferring data between different computer-aided design systems.

BACKGROUND OF THE INVENTION

Computer-aided design ("CAD") software systems are used by mechanical engineers, industrial designers, manufacturing engineers, production engineers, and others, in the process of designing and manufacturing physical products. During this process, large amounts of data of considerable complexity are generated.

In any application, it is crucial to be able to exchange data between different software systems. For example, data exchange is essential when switching to a different system or concurrently working with several different systems. Further, such exchange is useful for collaboration between different departments in the same company, for collaboration between different companies, for data archiving, data catalogues, interapplication operability, and general data management. Currently, only a small fraction of data can be exchanged between CAD systems.

This application discusses the exchange of data used in the design process. However, the methods and systems of this invention can be applied to other types of data as well, including but not limited to planning, manufacturing, tolerancing, and inspection. Furthermore, the methods and systems of this invention can be used to facilitate collaboration between people using different computer systems, as well as for publishing data in a widely readable format while controlling the amount and level of detail of the published data.

One paradigm of current CAD systems is called parametric feature-based design. In parametric feature-based design the user interacts with the system by sequentially adding features to the designed part. A feature is an operation that modifies the geometry of the part or some other aspects of it in a predefined way. Features are parametric, meaning that the way they modify the geometry of the part is controlled by parameters. These parameters can be changed at any time by the user, thereby modifying the whole part. The process of computing the full geometry of the boundary of the part from parameter values is usually called 'regeneration' or 'rebuild' of the part. Each regeneration process produces a new instance of the part. One technical capability essential for implementing a regeneration process, is referred to as persistent IDs or persistent naming, and refers to the identification of similar model entities in different model instances.

The success of the parametric feature-based paradigm is usually attributed to two main factors. First, the fact that users express themselves in terms of features (and not, for example, in terms of explicit geometry) means that the system is more aware of the design intent. Second, the fact that features are parametric allows the user to modify objects easily while still obeying design intent and constraints. Since modifications occur very frequently during design, this capability saves time.

The description above does not imply that users must start by designing parts, and only then combine them into assemblies. On the contrary, modern design methods emphasize early conceptual design of the product without giving full details. Essential characteristics of the assembly can be specified before any detailed part design is made, and part dimensions can even be governed by them. The issue of whether design is done in a bottom-up manner, in a top-down manner, or iteratively is independent of the disclosure.

Formally, what the user designs is not a single part but a parametric family of parts. Each choice of dimensions and parameters (a parameter vector) yields, if legal, a different part (instance). Some systems support a somewhat different concept of a part family.

Before the advent of parametric feature-based design, the leading design paradigm was explicit specification of geometry. This method is cumbersome, but it also gives designers a high degree of control on the resulting shape. For some types of products, this method remains the preferred method to this day, for example for parts involving complex free-form surfaces. This method can also be attractive in some situations, e.g., when only the geometry (not the feature structure) is available.

In addition, parametric feature-based systems can be coarsely classified into 'pure' systems and 'hybrid' systems, the latter allowing users explicit (non-parametric) control over geometry. For the purposes of this invention, a parametric, feature-based system is referred to as a parametric system.

Several data classes arise in parametric feature based design and in explicit geometry design. Few CAD systems, if any, support all of the data classes. In addition, each data class contains a possibly large number of more specific types, called data types. Data types may have several subtypes, for example, if the data types have several construction methods. For the purposes of this invention, all sub-types, sub-sub-types, etc. are referred to as 'data types', unless stated otherwise. Various data classes are generally not independent; there are inter-relationships between them that are essential for correct and meaningful interpretation of the data.

There are three main types of difficulties associated with transferring data between CAD systems: (1) those related to input and output of various system architectures; (2) those related to systems' internal data formats; and (3) those related to numerical and algorithmic problems. To exchange data between different software systems, there must be a way to get data in and out of the systems involved. The possibility and ease of doing this depends on the software architecture of the system. For example, most current CAD systems include data classes which are not easily automatically inserted into or removed from the system. The user can, of course, see the data, but it is not easy to extract it through a computer program. The reason for this situation is threefold. First, most CAD systems were designed to be interactive; hence, the software designers have not spent much effort in providing means for automatic data communication. Second, most CAD vendors consider their data representation to be a trade secret, hence they try to keep it proprietary. Third, it is simply not that easy to provide elegant ways for automatic data extraction and creation.

There are many different data classes potentially used in CAD systems, and each of these data classes may possess a large number of specific data types. If the data formats of any two CAD systems are compared, most likely there will be differences. These differences can be of varying degrees.

For example, the entire paradigm for user interaction might be different (explicit geometry manipulation vs. parametric feature based design). There may be data classes supported by one system but not by the other. There may be specific data types supported by one system and not by the other. There may be specific data types whose behavior in terms of the geometry they produce is different from system to system even if the specification of the data types seems identical. This is because there may be different ways of specifying the same specific data type. For example, a plane can be specified by giving three points on the plane or by giving one point and a direction normal to the plane.

Even when CAD systems have the same interaction paradigm and support a data class and all its specific data types, numerical or algorithmic problems might considerably impair the capability of exchanging data between them. For example, even if both systems are parametric and support the same types of features, this does not mean that each system supports exactly the same range of permissible parameter values for instantiating every feature. Therefore it is certainly possible that a single parameter vector will regenerate a model successfully on one system but will fail on the other system. In such a case the systems support different parameter spaces.

The reason for this phenomenon is two-fold. First, the semantics of feature instantiation have not yet been defined formally and each system implements the semantics independently using its own heuristics. Even if in most cases the end result seems the same, in some cases the fact that the instantiation algorithms are different might produce different results. Second, each system uses a different geometric tolerance when computing with geometry. For example each system may define differently when two surfaces intersect and when two points are considered to be the same point. The tolerance used affects the success or failure of the operation. Feature instantiation computations make heavy use of geometric operations, hence their success or failure for certain parameter values are highly sensitive to the tolerance policy implemented.

There are two major approaches to data exchange: through neutral file formats and through application program interfaces ("APIs"). Current activities in both approaches handle only some of the data classes. There are successful neutral file formats for 2-D drawings and 3-D geometry, format proposals for 2-D sketches and relationships, and partial proposals for the feature structure. The neutral file format approach does not address interfacing with individual CAD systems, assuming this issue should be solved independently by vendors or others. Most advocates of the API approach concentrate their efforts towards defining a common API for extracting data from CAD systems. Such an approach cannot deal with situations in which there are several APIs, and does not deal with feeding a model's specification data into CAD systems.

BRIEF SUMMARY OF THE INVENTION

In one aspect, the invention relates to a method for converting specification data in a source CAD format from a source CAD system to a target CAD format on a target CAD system, the method including the steps of: providing a source CAD model including the specification data in the source CAD format; extracting the specification data from the source CAD model; and generating a target CAD model including the specification data in the target CAD format for the target CAD system. In a further aspect, the method includes the step of translating the specification data from the source CAD format to the target CAD format. In yet a further aspect, the translating step includes substantially losslessly translating the specification data. In another further aspect, the method further includes the step of re-translating the specification data from the target CAD format to the source CAD format. In yet a further aspect, the re-translating step includes substantially losslessly translating the specification data. In a further aspect of the invention, the method further includes the steps of: translating the specification data from the source CAD format to an intermediate CAD format; generating an intermediate CAD model including the specification data in the intermediate CAD format; and translating the specification data from the intermediate CAD format to the target CAD format.

In a further aspect of the invention, the method further includes the steps of: identifying an element in the source specification data which is not supported in the target CAD format; and emulating the element in the target CAD model.

In another aspect, the invention relates to a method for converting specification data from a source CAD model in a source CAD format on a source CAD system including the steps of: providing a source CAD model including the specification data in the source CAD format; and extracting the specification data from the source CAD model. In a further aspect of the invention, the method further includes the step of translating the source CAD model from the source CAD format. In yet a further aspect of the invention, the translating step includes translating the specification data into a target CAD format. In a further aspect of the invention, the translating step includes translating the specification data into an intermediate CAD format.

In another aspect, the invention relates to a method for converting specification data to a target CAD model in a target CAD format on a target CAD system including the steps of: providing a first CAD model including the specification data in a first CAD format on a first CAD system; and generating the target CAD model including the specification data in the target format on the target CAD system, wherein the target CAD format is different from the first CAD format. In a further aspect of the invention, the method further includes the step of translating the specification data to the target CAD format. In a further aspect of the invention, the method further includes the step of translating specification data from a source CAD format. In yet a further aspect of the invention, the translating step includes translating the specification data from an intermediate CAD format.

In another aspect, the invention relates to a method for converting specification data in a source CAD format including a first data level from a source CAD system to a target CAD model on a target CAD system including a second data level, wherein the first and second data levels are selected from a plurality of data levels, the method including the steps of: providing a source CAD model including the specification data in the source CAD format at the first data level; extracting the specification data from the source CAD model; and generating a target CAD model including the specification data in the target CAD format at the second data level for the target CAD system. In a further aspect of the invention, the method further includes the step of determining a highest data level sufficient to map the source specification data.

In another aspect, the invention relates to an apparatus for converting specification data in a source CAD format from a source CAD system to a target CAD model on a target CAD system, including: a source CAD model including the specification data in the source CAD format; an extractor extracting the specification data from the source CAD model; and a generator generating a target CAD model including the specification data in the target CAD format for the target CAD system. In a further aspect of the invention, the apparatus includes a first translator translating the specification data from the source CAD format to the target CAD format. In yet a further aspect of the invention, the first translator translates the specification data substantially losslessly. In a further aspect of the invention, the apparatus includes a second translator re-translating the specification data from the target CAD format to the source CAD format. In yet a further aspect of the invention, the second translator translates the specification data substantially losslessly. In a further aspect of the invention, the apparatus includes: a first translator translating the specification data from the source CAD format to an intermediate CAD format; a generator generating an intermediate CAD model including the specification data in the intermediate CAD format; and a second translator translating the specification data from the intermediate CAD format to the target CAD format. In a further aspect of the invention, the apparatus includes an identifier identifying an element in the source specification data which is not supported in the target CAD format; and an emulator emulating the element in the target CAD model.

In another aspect, the invention relates to an apparatus for converting specification data from a source CAD model in a source CAD format on a source CAD system including: a source CAD model including the specification data in the source CAD format; and an extractor extracting the specification data from the source CAD model In a further aspect of the invention, the apparatus includes a translator translating the source CAD model from the source CAD format.

In another aspect, the invention relates to an apparatus for converting specification data to a target CAD model in a target CAD format on a target CAD system including: a CAD model including the specification data in a first CAD format on a first CAD system; and a generator generating the target CAD model including the specification data in the target format on the target CAD system, wherein the target CAD format is different from the first CAD format. In a further aspect of the invention, the apparatus includes a translator translating the specification data to the target CAD format.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which.

DETAILED DESCRIPTION OF THE INVENTION

Figure 1A:
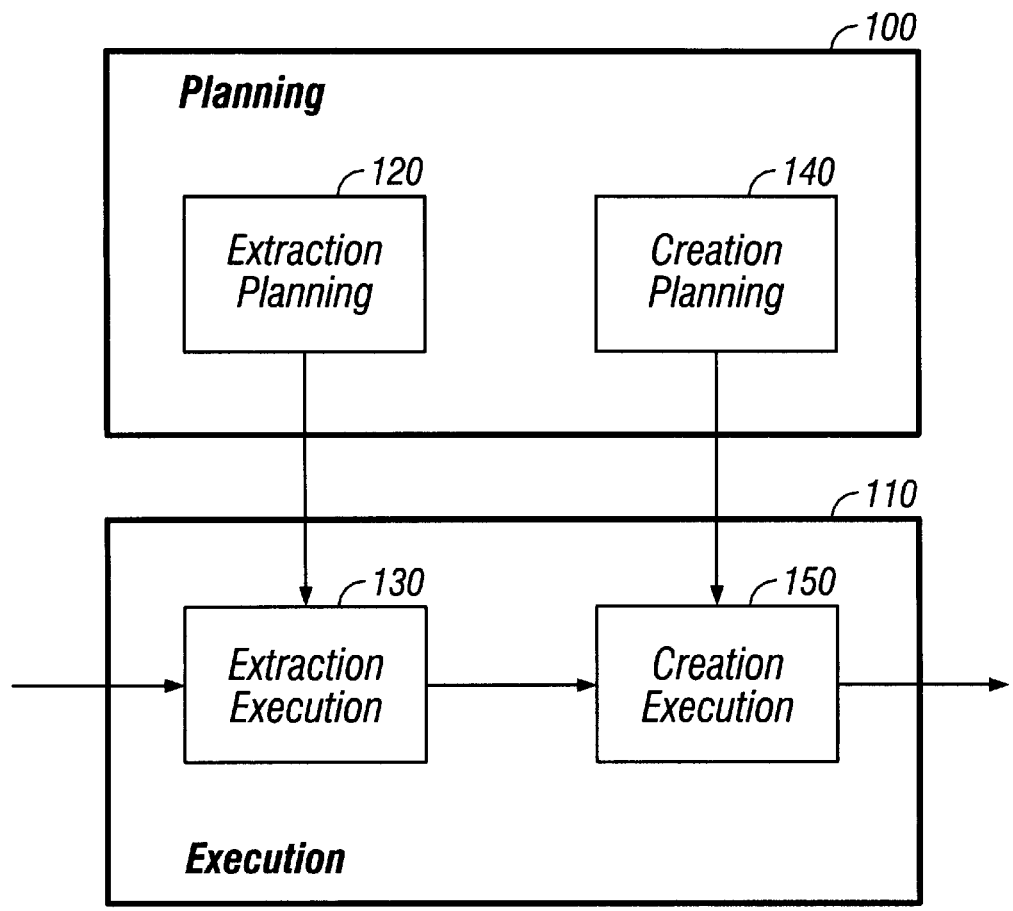
FIG. 1A is a flowchart depicting an embodiment of the steps of the invention for converting specification data from a source format to a target format.

The system and method of this invention enable the exchange of a range of data classes that is typically wider than existing methods, and provide the capability of extracting data from and importing data into systems without requiring the systems to expose their data through a programming interface. The invention has the ability to handle both data models that are not compatible between systems and the numerical and algorithmic incompatibilities between systems. A data type is fully supported by the system if it is possible to create and modify a data item of this type in the system using the system's user interface, such that the created item has the intended semantics. Data semantics include all the operations that can be done on the data and the range of mathematical statements that can be asserted on the data. The definition of a fully supported data type does not require that all items of a type can be created, because concept of full support is independent of the size of the parameter space. Hence, it is still possible that a system fully supports a type but will not be able to successfully create a specific data item belonging to this type.

A data class is fully supported by a system if all of its specific types are fully supported. For some data classes, full support of all data classes may not be realistic. For example, according to the definition, full support for the 'feature structure' class implies full support for every feature type. Since the number of possible feature types is large and not even bounded, new types can be introduced all the time, full support for the feature structure class may be impossible. However, at any given time, the number of feature types supported by a fixed set of CAD systems is finite. Hence, a system fully supports the feature structure class with respect to a particular date and to a reference set of CAD systems.

A data type is partially supported by a system if some of its inherent operations are supported and some are not. In particular, a data type that can be viewed but not edited, or viewed and edited but not created, is partially supported.

Lossless exchange of a data type refers to the transfer of items of the data type from a source system to a target system such that they have the same semantics in the target system as in the source system. Note that lossless exchange must preserve, among other things, all aspects of the data type that the user can interact with. In particular, if the source system is parametric, lossless exchange must preserve the feature structure, including the number and identity of dimensions. Therefore, if an exchange adds dimensions it is still considered lossy.

Lossless two-way exchange of a data type refers to the transfer of items of this type from a source system to a target and then back from the target to the source, such that the result in the source has the same semantics as the original. Note that lossless two-way exchange is not equivalent to two lossless one-way exchanges. It might happen that the target system cannot support the semantics of all data from the source system, but the data can still be transferred back to the source system losslessly. Lossless two-way exchange is mostly useful when the data is modified in some way in the target system, otherwise the source system would simply use the original data and the transfer back would not be necessary. A particular kind of lossless exchange is called a complete exchange, which refers to the case when all data classes are losslessly transferred.

With lossy exchange (either one-way or two-way), some or all of the semantics of the data type are lost. Lossy exchange has several causes, including but not limited to: (1) the new data being of a lower level of abstraction, (2) the new data being viewable but not editable and (3) the new data being viewable and editable, but items of its are not creatable.

Generally the source system and the target system are different systems. However, two systems are not considered different if one system has been derived from the other system. Methods of derivation include removal of some of a system's capabilities, modifications to a system's interfaces (including its user interface), repackaging, and other such manipulations. Similarly, two different versions of the same system are not considered to be different.

Referring to FIG. 1A, in overview, the present invention may be considered to have two conceptual stages: planning (step 100) and execution (step 110). Each of these stages includes extraction (steps 120 and 130) and creation (steps 140 and 150) substages. Generally, the planning stage (step 100) designs a mechanism for transferring specification data which the execution stage (step 110) uses to perform the actual transfer. An example of specification data is the feature structure, from which a parametric CAD system derives an object's 3-D geometry.

The planning stage (step 100) is a pre-process operation performed once for every CAD system for which it is desired to transfer specification data, and is performed on both source and target CAD systems. The planning stage (step 100) designs a method for moving specification data into or out of a CAD system. The planning stage (step 100) includes two substages, extraction planning (step 120) and creation planning (step 140). Extraction planning (step 120) designs a method of transferring specification data out from a source CAD system. Creation planning (step 140) designs a method of transferring specification data into a target system. In one embodiment, the extraction planning (step 120) and creation planning (step 140) substages design a method of transferring specification from a source CAD system directly to a target CAD system.

In an alternate embodiment, extraction planning (step 120) designs a method of transferring specification data out from a source CAD system to an intermediate format, and creation planning (step 140) designs a method of transferring specification data from an intermediate format into a target CAD system. In a further embodiment, the intermediate format comprises the space of all data classes and types partially or fully supported by at least one CAD system. In this embodiment, the intermediate data format is called the united data model.

The planning stage (step 100) is typically redone on two occasions. When the system's data model-related capabilities change, both extraction planning (step 120) and creation planning (step 140) are performed again. When the united data model changes, only the creation planning (step 140) is redone. Although there is no need to redo the planning for every exchange transaction, the execution stage (step 110) is performed once every exchange transaction.

Figure 1B:
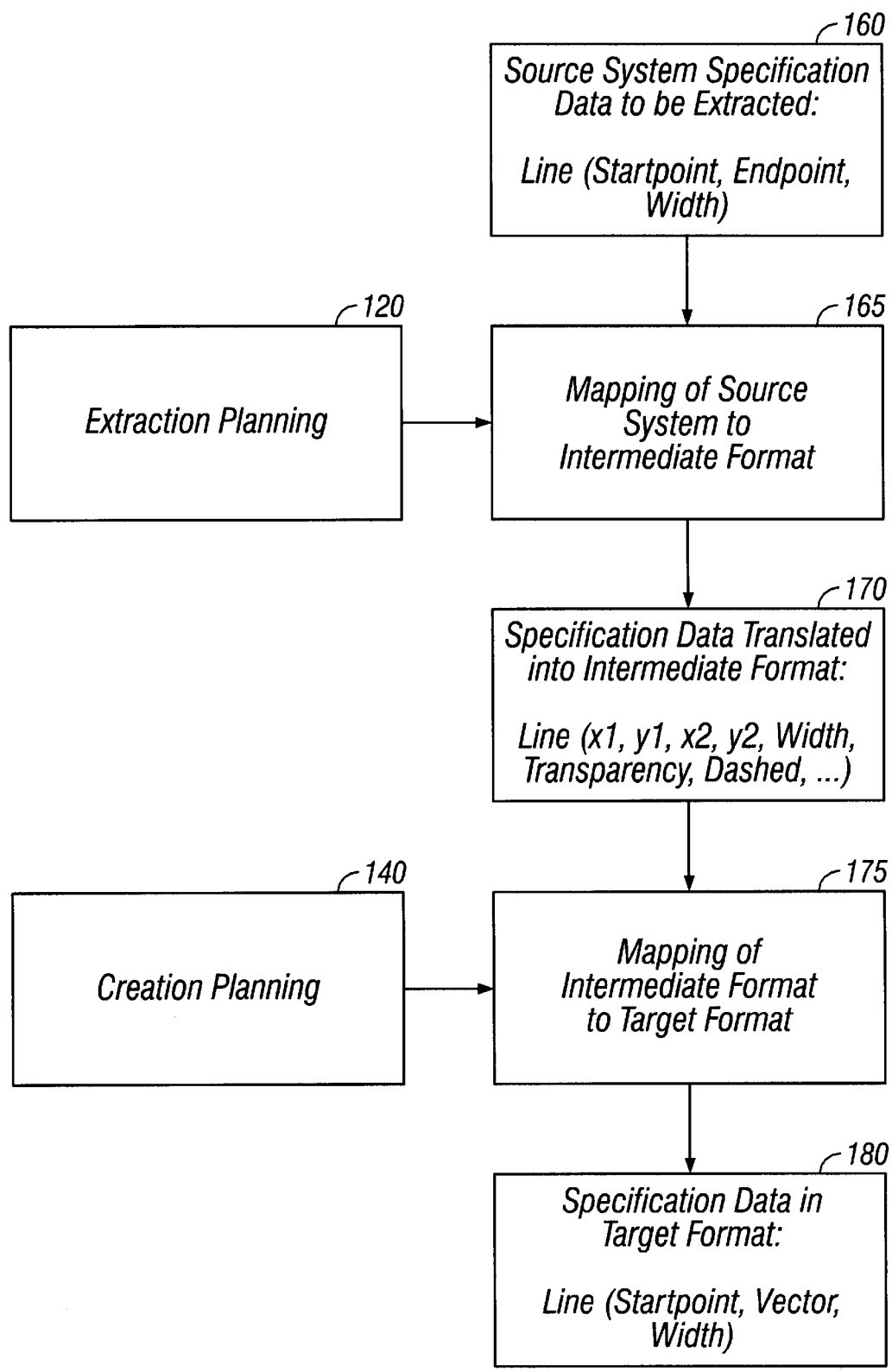
FIG. 1B is a flowchart depicting an embodiment of the steps of the invention employing an intermediate format.

One embodiment of the invention, as depicted in FIG. 1B, employs an intermediate format 170 to convert source system specification data 160 to target system specification data 180. In this embodiment, the extraction planning stage (step 120) creates a source mapping 165 of the source system to the intermediate format 170, and the creation planning stage (step 140) creates a target mapping 175 of the intermediate format 170 to the target system. In the example illustrated in FIG. 1B, a line is represented in the source system by defining a start point, an end point, and a line width. In this example, a line is represented in the target system by defining a vector and a width. In this example, a line is represented in the intermediate format 170 by defining a plurality of parameters, including a two pairs of (x, y) coordinates, line width, transparency, and whether or not the line is solid or dashed.

In more detail, in extraction planning stage, the data model of the source system is studied by a programmer who devises a plan for extracting all relevant data from it. When devising the plan, it is important to determine which data are relevant. A piece of data is considered relevant if (1) it was specified by the user and is not obviously relevant only to the source system, or (2) it is essential for creating the model successfully in the target system. In practice, a piece of data's relevance is determined according to the customer's requirements and priorities. In particular, items belonging to any of the data classes as shown in Table 1 are considered to be relevant, particularly features and feature structures.

Part of the extraction planning stage (step 120) can be considered as a conceptual mapping of the data model of the source system into an intermediate format such as the united data model. In practice, this is done by studying the behavior of a source CAD system to understand the semantics of different operations and equivalencies between them. The mapping is only conceptual, because it does not require that the united data model be indeed represented in a united, common way for all systems (although this could be beneficial from an implementational point of view). The location and format in which the extracted data is stored are immaterial to the method. It may be stored on a disk file or in computer memory; it may be stored in a binary or ASCII format; it may be organized in a relational data base, an object-oriented data base, in a single unorganized file, as a sequential list, or in any other method. The only requirement is that the types, arguments and inter-relationships of the data items are clearly labeled so that they can be identified. The order of execution of extracting the various data classes is immaterial, as long as the correct associations between data items are stored. Data classes for which a standard neutral file format exists may be stored in that format. However, care should be taken to record and store their inter-relationships with data classes not supported by the neutral file format. The inter-relationships between the data items is not related to the persistent naming problem, because persistent naming only constitutes a problem when there are changes to parameter values. In this embodiment, the model is completely static, so static data pointers are sufficient and there is no need for persistent names.

Figure 2:
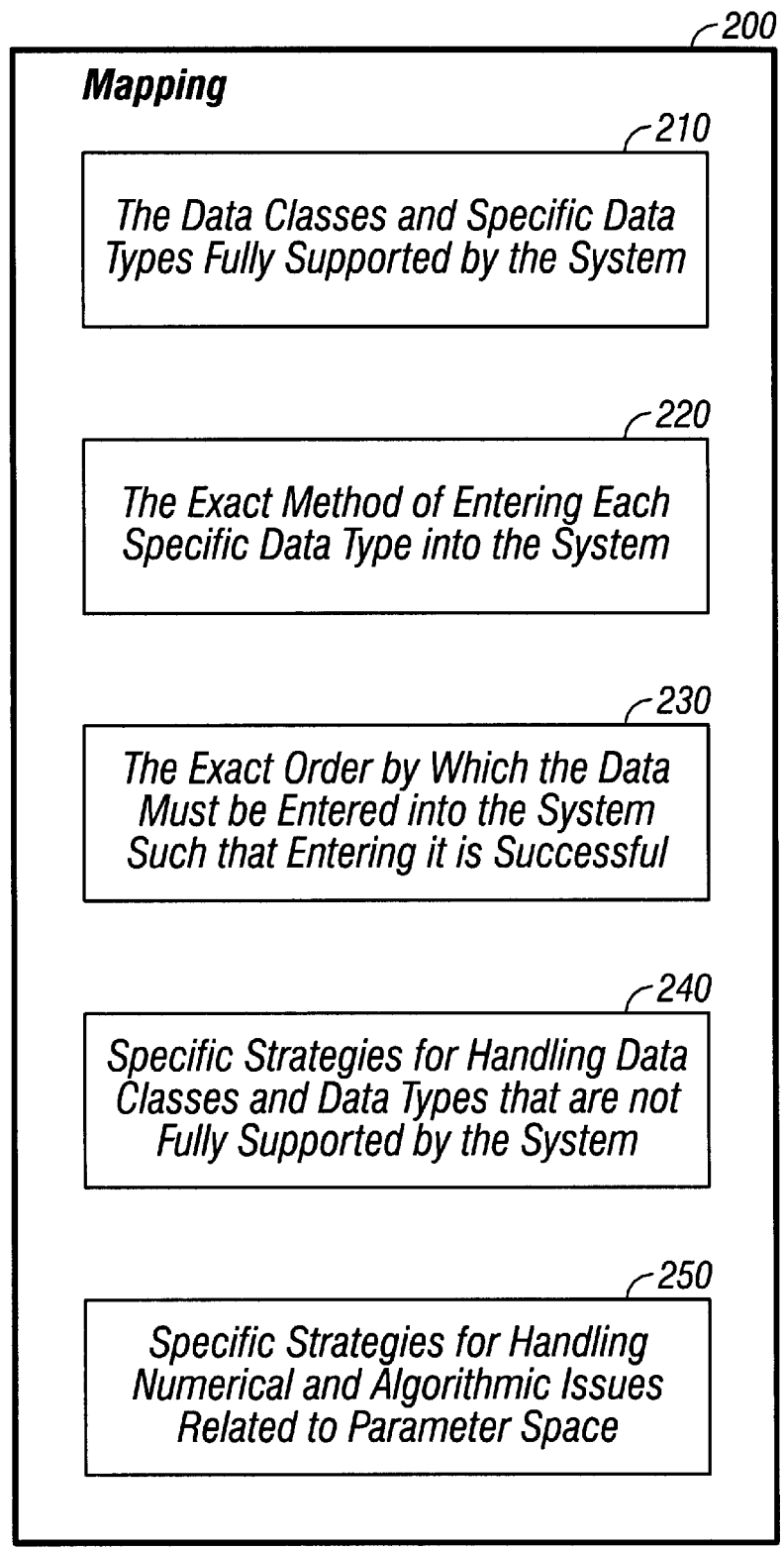
FIG. 2 is a schematic block diagram depicting a mapping built during the creation planning stage of converting specification data to a target format.

The creation planning stage (step 140), as further illustrated in FIG. 2, prepares a mapping 200 from the united data model to a target system's data model. The mapping 200 is used for generating the specification data on the target system. The mapping specifies: (1) the data classes and specific data types fully supported by the target system 210, including their arguments and semantics; (2) the exact method of entering each specific data type into the system 220, such as by using an API, user emulation, or a system-specific technique; (3) the exact order by which the data must be entered into the system such that entering it is successful 230, for example the need to create a 2D sketch before creating an extrusion feature that requires the sketch as an argument; (4) specific strategies for handling data classes and data types that are not fully supported by the system 240, such as mapping an "extrude-draft" feature on to the two simpler features "extrude" and "draft"; and (5) specific strategies for handling numerical and algorithmic issues related to parameter space 250, such as storing the geometric effect of a feature to recognize and correct numerical inaccuracies on the target CAD system.

Referring again to the example given in FIG. 1B, the source CAD system represents a line using three parameters: startpoint, endpoint, and width. In this example, a line is represented in the intermediate format using several parameters including: starting x coordinate, starting y coordinate, ending x coordinate, ending y coordinate, width, transparency, and whether or not the line is dashed. Extraction planning (step 120) designs a method (step 165) for translating a representation of a line in the source CAD system into the intermediate format by splitting the startpoint parameter into the starting x and y coordinates, and the endpoint parameter into the ending x and y coordinates, respectively. The width parameter is transferred directly. Other parameters in the intermediate format are either left unset or set to default values.

In this example, the target CAD system represents a line using two parameters: vector and width. Creation planning (step 140) designs a method (step 175) for translating a representation of a line in the intermediate format into the target CAD format by calculating the vector parameter from the starting and ending x and y parameters. The width parameter is again transferred directly. All the remaining parameters in the intermediate format are ignored.

A central principle used in the creation planning stage (step 140) is to let the target system create derived data using its own capabilities whenever possible. Derived data is automatically computed by a system for internal or external purposes. For example, derived data can be used for 3-D geometry, which can be viewed graphically, manufactured, or simulated for characteristics such as heat transfer and strength. There is a distinction between derived data and design intent, as expressed by data entered into the system by the user. For example, parametric feature based systems derive exact geometry from the feature structure. Although it is a central principle to let the target system create derived data itself, in some cases it may be desirable to transfer derived data as well, for optimization, viewing or other considerations such as lowering the level of abstraction for the created data. Derived data that has been explicitly transferred is best labeled as such, to avoid mismatches with derived data created in the target system. Note that many systems support a feature type that contains arbitrarily shaped exact geometry. In this case exact geometry is considered a feature and not derived data. In some cases there may be several possible mappings for a data type. A good exchange system should let the user specify policies and priorities between different mapping alternatives.

In one embodiment, the strategy developed during the planning stage (step 100) for converting an item belonging to a fully supported data type is to use built-in capabilities of the target systems whenever possible. The item is created in the target system using methods of the highest level of abstraction possible. In particular, if an item can be derived from other items, the creation planning stage (step 140) develops a strategy to derive it rather than create it directly. For example, all CAD systems fully support the 'exact geometry' class, but exact geometry will not be employed in the target system if it is a parametric system. Instead, the target system's 'regeneration' function is employed to create exact geometry from the feature structure.

When developing a strategy for data during the planning stage (step 100), it is important to consider which data types are supported by the CAD system being examined. In some cases full support for one data class implies full support for other classes. For example, full support for the 'feature structure' class implies full support for sketches. Such dependencies usually imply an ordering by which data must be created in the target system.

In the creation planning stage (step 140), it is important to verify that the selected creation operators of the target system indeed create data with similar semantics to that in the source system. It is certainly possible that creation methods that look similar on the surface produce unacceptably different results. This behavior results from the lack of an accepted, formally defined, common 'vocabulary' of data types. Note that sometimes creating a single data type is achieved by several actions of the target system.

Persistent names are not necessary to create the feature. Feature attachment information can be encoded by selecting concrete boundary entities, identified by using their geometry. This selection is coordinate-system dependent, but there is nothing wrong with that because the object is positioned in the same coordinate system (preferably, even in the same graphical view) that it was created in. This method lies conceptually between a log file and persistent names. It is not a log file, because user events are not stored. Selected objects are stored in a higher level representation. Note that persistent names can always be recovered from the representation if needed (for example, some failure handling strategies might need them).

Note that a selection of one geometric entity in one CAD system may correspond to several entities in a target CAD system. In general, there is a many-to-many mapping between different CAD systems. Fortunately, the similarity of these geometric entities simplify this mapping. For example, an edge-chain serves as an input to a round feature. The source CAD system represents the edge-chain by its starting and ending vertices and a point on every edge encountered in-between. In the target CAD system, a simple boundary tracing algorithm can be invoked to discover the edges comprising the desired edge chain. This method will succeed even if the number and identity of the resulting edges are different from those in the source CAD system.

In the planning stage (step 100), it is important to develop strategies for transferring unsupported data. There are two main options for converting unsupported data: (1) enhance the system so that transfer is lossless; (2) or use a lossy transfer. There are four methods to tackle partially supported or unsupported data: (1) system enhancement, (2) usage of attributes, (3) usage of links to external data, (4) usage of built-in system capabilities, and (5) usage of a hierarchy of mappings.

System enhancement allows independent developers to add functionality. When the target system is extensible, one strategy for dealing with unsupported data is to extend the system with add-ons that support this data. The extension can provide for all transfer degrees: full support view and edit, view only, or conversion to a lower abstraction level. The degree of extensibility greatly differs between systems and between data classes in the same system. For example, a system might allow add-ons direct access to exact geometry and invocation of add-ons through the system's user interface, but will not enable the implementation of a new feature type. Implementation of add-ons is known by one of ordinary skill in the art of using and implementing CAD systems.

Another strategy available during the planning stage (step 100) involves the attachment of attributes. Many systems support the attachment of attributes to the model. The system treats attributes as comments that are understood only by the user or by other programs. Attributes are stored, displayed to the user, and sometimes can be edited by the user. Sometimes they can only be created through an API. In one embodiment, unsupported data items can be stored as attributes. This can serve two different purposes: (1) visualization; and (2) two-way exchange. The goal of visualization is to convey information about the unsupported data to the user. The result is similar in spirit to the case when the system is extended by an add-on that allows viewing the data. However, an add-on can in principle support any kind of visualization, while here we are limited to the attribute viewing capabilities provided by the target system. These may be sufficient for some data types.

To provide for two-way exchange, the data unsupported by the target system must be stored somewhere, preserving its inter-relationships with supported data. Attributes can serve this purpose. These attributes are not meant to be seen by the user, so their display can be turned off. If the system allows grouping of attributes into user-defined (or program-defined) categories (e.g., by using layers), then all such attributes can be grouped into an auxiliary layer whose display is turned off while still viewing other types of attributes. Note that there may be limitations on the size of an attribute, which may require splitting data between several attributes. In addition, the data must be converted to a type that can be stored in attributes. When completing a two-way exchange, i.e. when moving data from the target system back to the source system, the attributes are used in order to recall the original data of the source system so that this data can be recreated in an optimal way in the source system When attributes are associative, that is, they are persistent under regenerations and under as many model editing operations as possible, the object can be modified in the target system while still providing for lossless two-way exchange of the attributed data. The exchange is not necessarily a globally lossless two-way exchange because it might happen that the target system added data types not supported by the source system. Attributes can be used as links to externally stored data, which may in some cases be a better solution for complete two-way exchange due to the complexity or size of the unsupported data.

During the planning stage (step 100), it is important to consider the level of abstraction employed to represent data types in the CAD system under examination. Certain data types have a high level of abstraction relative to other data types. Some high-level data types can be emulated by a combination of lower-level data types. When the target CAD system does not support a feature, the feature can usually be mapped into a combination of simpler features. If the feature cannot be mapped into simpler features, the feature can still be represented in the target CAD system by its exact geometry. For example, an auxiliary feature containing three orthogonal planes can be emulated by instantiating three separate single auxiliary plane features. If a high-level data type such as the three-orthogonal-plane is supported on the source system but not the target system, a combination of lower-level data types supported by the target system can be used to emulate the source system's high-level data type. In this case, users of the target system will not notice the lower abstraction level. However, if the model is transferred naively back to the source system, users who used the three-orthogonal-plane feature will be surprised to see three different single plane features. The mechanisms for lossless two-way exchange discussed above should be used in order to avoid such lossy exchange.

Naturally, there are data types that are essential for continuing working with the model, in the sense that attributes, view only support, or a lower abstraction level do not suffice for subsequent operations. In that case, lossless exchange requires implementing them as enhancements on the target system.

Both the extraction planning stage (step 120) and creation planning stage (step 140) should include quality assurance provisions for verifying that the execution stage has been completed successfully. The quality assurance provisions should further provide strategies for what to do in case of failure. Failures can occur mainly due to one of the following reasons: (1) one of the plans might be erroneous; (2) their implementation might be erroneous; (3) the source or target systems might behave in an unexpected erroneous way (an expected error should be taken into account when preparing the plans); and (4) general computer system problems such as transient hardware, network or operating system problems.

In one embodiment, due to the complex nature of the task and the many possible reasons for failure, tightly integrated verification mechanisms are built into the plans. In another embodiment an external problem reporting mechanism is provided. For example, such a reporting mechanism in one embodiment is an automatic internet-based program for sending failed models to a central location. At the central location either a person manually checks the result of failure, or a more sophisticated automatic program is present for handling the failure. In one embodiment the testing strategy is to verify that instances generated by several different parameter vectors are geometrically identical up to a certain tolerance.

For the planning stage (step 100), the extraction and creation of different types of data by different methods must be taken into consideration. Specific data extraction and creation methods include: (1) extraction and creation of data exposed by the API; (2) extraction and creation of data exposed by scripts; (3) reading or generating data files having a documented format; (4) displaying user interface ("UI") objects on the screen and reading data from them or entering data into them; (5) interaction with and manipulation of 3-D or 2-D graphical views of the object; (6) iterative regeneration and interrogating of the model with different parameter values; and (7) a combination of some or all of the above.

Data exposed by an API can usually be extracted or created or both. Most systems do not expose all data through their APIs. In many systems there is no symmetry between extraction and creation capabilities (for example, many systems allow data to get in but do not allow it to get out). In addition, APIs for similar data classes can be radically different on different systems. Many data classes can be extracted from and created in CAD systems simply by invoking 'save' or 'read' options from the system's user interface. For example, data classes supported by standards such as IGES or DXF can be extracted or created by saving or reading the model in these formats. Any format whose syntax is documented can be used. Read and save can be done through an API, scripts, or user emulation. In case the data files have already been created, they can be directly read without using the source system itself.

The execution stage (step 110) is performed on every exchange transaction. The execution stage includes the substages of extraction execution (step 130) and creation execution (step 150). In the execution stage (step 110), the extraction and creation plans are executed on every exchanged model.

The execution stage (step 110) involves communication with the CAD systems. Specifically, the extraction execution stage (step 130) involves communication with the source CAD system, and the creation execution stage (step 150) involves communication with the target CAD system. There are generally three technical ways of automatic communication with software systems: (1) using an application programming interface ("API") supplied by the system vendor; (2) using batch capabilities supported by the system vendor; and (3) user emulation.

Considering the use of first way, many systems provide an application programming interface ("API") that allows extractions and creation of some data, as well as invocation and extension of system functionality. Such an API can be provided in any programming language such as C++ and Visual Basic. An API can be implemented in a way that supports inter-process communication or even remote inter-process communication.

The second way to communicate with a CAD system is through batch mode. Some systems support invocation of system functionality through scripts run by the operating system in batch mode. Scripting is a kind of an API, but it is usually easier to use because it requires less programming skills. A particular kind of script used by CAD systems is called a 'log file', which records user actions during a session and can be played back to recreate the session's outcome. Log files record absolute user actions (e.g., mouse coordinates) and are only useful to recreate a design session. They were not intended for automatic creation and playback of a design session, but they can be used for that purpose if their syntax is understood.

The third method of communication with software systems is user emulation. Graphical user interfaces (GUIs) use various kinds of 'events' to communicate user actions (and sometimes internal GUI actions) to software systems. For example, mouse or keyboard clicks performed by the user are sent to the system to be processed. In some cases they are not sent directly, but are translated to other, higher level events, which are then sent to the system. For example, a mouse click might be translated to a 'window focus', 'icon click, or 'menu selection' events. Many operating systems used by CAD systems support sending events by a program to itself, to other programs, or to the screen, given that the sending program possesses the appropriate permission (security) level. Any user action can be emulated in this manner. Once the desired user actions are known, it is possible to write a program that emulates these actions by sending events to the CAD system.

Timing in such a system is important, because, for example, if the effect of a first event is to open another window on the screen to which a second event should be sent, then the emulator should wait until the window actually appears before sending the second event, otherwise the second event could be lost. Operating systems allow a program to query the status of user interface objects such as windows, menus and dialogues, and thus an emulator can query the status of the User Interface (UI) of the CAD system to ensure proper delivery of events. Note that the UI of the CAD system must, if designed properly by the system vendor, indicate to the user through some UI object that the system is not yet ready to accept further user actions (for example, replacing the mouse icon by an hourglass, etc.) By querying the status of UI objects, the emulator can determine when the CAD system is ready to receive the next emulated event.

In one embodiment of the invention, the creation execution stage (step 150) employs an interactive user interface for loading models into a system, in order to let the user correct errors that the exchange program cannot correct automatically, or to make decisions where there are several possible alternatives.

Many types of data appear on various user interface ("UI") objects, such as lists, dialogues, and text fields. Using the methods of communication described above, user interface objects can be used to display and enter the desired data.

In one embodiment of the invention, the creation execution stage (step 150) transfers specification data to a target CAD system which cannot represent data at the same level of abstraction as the source CAD system. In this embodiment, the creation execution stage (step 150) attempts to create specification data in the target CAD system at the same level of abstraction used in the source CAD system. If the target CAD system is unable to create the specification data, the creation execution stage (step 150) then attempts to create the specification data in the target CAD system at a lower level of abstraction. The creation execution stage (step 150) iteratively attempts to create the specification data on the target CAD system at ever lower levels of abstraction until successful. In a further embodiment, the specification data is stored in a intermediate file format including the exact geometry of every feature in the source CAD model.

For example, one embodiment of the invention can store for a "round" feature the surfaces generated by the feature plus an indication of which surfaces they replaced in the object prior to the execution of the round feature. This is useful, for example, when creating the round feature in a target system that does not fully support a round feature, in which case the round feature will be mapped to a lower level of data abstraction, namely geometry. The round's geometry will be created in the target system using surfacing operations or features so that the resulting geometry in the target system is the same as in the source system.

When communicating to the source CAD system during the extraction execution stage (step 130), it is important that the specification data be displayed correctly so that it can be extracted correctly. In some cases, geometric parts of the current object must be selected on a 2-D or 3-D graphical view in order to get the correct information displayed on user interface objects or in order to provide arguments to a creation operation. This can be done by using an API or user emulation. Implementation of this technique involves two general stages: (1) definition of a suitable graphical viewing transformations for getting the object to be displayed in the desired position, orientation, size and style; and (2) selection operations in order to select the desired sub-elements of the object.

In one embodiment, the extraction execution stage (step 130) employs the user interface ("UI") of the source CAD system. In this embodiment, specification data can be extracted by capturing a bitmap of the UI window of the source CAD system, including the graphical view window, and analyzing the graphical depiction of data entities. For example, the source CAD system allows for text notes to be associated with boundary entities such as vertices and edges. The text notes are displayed on the source CAD system as an arrow pointing to the entity with which they are associated. During extraction execution (step 130), a bitmap image of the specification is scanned for the presence of arrows. When an arrow is found, a 3D graphical "selection" operation is executed on the model to find the associated entity. If the arrow represents more than one associated entity, the process can be repeated until all associated entities are located.

In one embodiment, the extraction execution stage (step 130) employs a method called model interrogation. In model interrogation, some data types can be extracted by regeneration of the model several times, each time with a different parameter vector, and comparing the different exact models generated. For example, assume the user needs to determine whether a hole feature is a blind hole (i.e., having a fixed depth) or a through hole (i.e., extending until some surface). Assume also that the name and value of the dimension showing the hole's depth has been extracted. Using user emulation or the API, the dimension's value, can be modified to be much smaller than the distance to the nearest surface, the model can be regenerated, and the hole's depth can be evaluated. If the hole's type is a through hole, then the hole will still extend until at least the next surface. Otherwise, it will not. Similarly, one embodiment of the invention can discern which edges have been rounded by comparing the object's topology and/or geometry before and after execution of the round feature.

In one embodiment, the extraction execution stage (step 130) employs a geometric analysis of the specification data. Specifically, the extraction execution stage (step 130) compares the exact geometry of the specification data before and after the invocation of a feature. The extraction execution stage (step 130) uses the result of this comparison to deduce the feature's parameters. For example, geometric analysis can discover that an object's edges have been rounded by the invocation of a "round" feature and deduce the radius of the rounding.

Some or all of these methods can be used to extract or create even a single data type in the execution stage (step 110). For example, in the creation execution stage (step 150) a feature creation operation usually involves both determining its type and other symbolic arguments (using User Interface objects or an API) and selection of geometric entities on a graphical view (using user emulation of an API).

In another embodiment, the invention uses data hiding when performing the execution stage (step 110). In some applications, users may desire not to transfer some of the data classes. Some examples are: (1) hiding advanced design techniques (relationships, features) from other companies (sub-contractors, suppliers); (2) not transferring data classes that are not relevant to users of the target system due to efficiency considerations; and (3) hiding irrelevant data classes in order not to clutter the user's workspace. In one embodiment, the users can specify their intentions when initiating data exchange. Data hiding can be achieved by using a 'suppress' functionality of the target system, by using links from the target system to external data, or by not extracting the data at all. For example, instead of transferring the relationships between variables, the values of the variables themselves can be transferred without their interrelationships.

In one embodiment, only partial specification data is transferred. In a further embodiment, only changes made to the specification data are transferred. In this embodiment, the source CAD system and target CAD system include the same specification data, except that changes have been made subsequently to the specification data on the source CAD system. In this embodiment, the changes can be extracted from the source CAD system and created on the target CAD system so that the source CAD system and the target CAD system once again include identical specification data. In a further embodiment, the changes are highlighted or emphasized on the target CAD system.

In one example, the source CAD system supports a 'save' option on its user interface which, when invoked, stores the model's specification data in a disk file. In this example, the extraction planning (120) substage devises a two-step method for transferring the specification data from the source CAD system. The first step is to emulate a user, and invoke the source CAD system's 'save' option via its user interface. The second step is to read the specification from the disk file.

In another example, the target CAD system supports the use of scripts for inputting data. In this example, the creation planning (140) substage devises a two-step method for transferring the specification data into the target CAD system. The first step is to generate a script file containing the necessary commands to create the specification data in the target CAD system. The second step is to instruct the target CAD system to read the script file. This instruction can be given by the source CAD system's UI or API.

In some cases, it is best to combine some or all of the above methods. For example, we can use the target system's built-in capabilities can be used to create data having a lower abstraction level, followed by the use system enhancements implemented through its API to bring the data back to the higher abstraction level.

Equivalents

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are therefore intended to be embraced therein.

TABLE 1

| Data Classes | |
| --- | --- |
| 2-D sketch. | A two-dimensional entity containing several types of objects, such as geometric elements, dimensions between the geometric elements, constraints on and between the geometric elements, and attributes. |
| Feature | Each feature must possess: (1) a type, e.g. extrusion or hole, and (2) attachment information for how to connect the feature to the current part. In addition, a feature may possibly possess other arguments: (1) sub-type, e.g., linear or revolution, (2) auxiliary geometry, e.g., 2-D sketch or auxiliary (datum) planes, (3) continuous numerical parameters, e.g., depth, and (4) discrete numerical parameters, e.g., the repeating number in pattern features. |
| Feature structure. | The feature structure of a single part can be viewed as a tree of features. The structure is a tree because a feature's arguments may be features themselves. |

TABLE 1-continued

Data Classes

| | |
|---|---|
| Assemblies | A grouping of several parts. An assembly includes the parts themselves and constraints for positioning them relative to each other. |
| User defined features (UDFs). | Some parametric systems allow the user to define new features not natively supported by the system. This is usually implemented by defining a certain feature structure as a single feature. |
| Relationships between variables | Various values in a model can be tied to each other, with the advantage that a change in one of them triggers changes in other values related to it. When values can change they are called variables. |
| Tolerances | Tolerances are associated with dimensions or with model boundary entities, and usually express a range of admissible values for the purpose of manufacturing. |
| Detailed geometry | In parametric systems, detailed geometry corresponding to a specific parameter vector is generated from the feature structure and other data classes. There are two main types of detailed geometry representations: those that aim at exact representation, and those that are only approximations. |
| Family tables | Some systems allow the user to define a discrete family of parts, by storing specific parameter vectors and the corresponding objects (plus attributes, e.g., their names). There may be relationships between the parameters. |
| Cross sections | Created by intersecting a 3-D part or assembly by a plane. |
| Drawings | 2-D depictions of a part or assembly, and can contain one or several of: (1) 2-D projections, (2) cross sections, (3) exploded views of an assembly, (4) various annotations (e.g., of tolerances and dimensions), (5) a textual listing of the participating parts. |
| Conceptual drawings | User-drawn key geometric elements and key dimensions (including relationships) which serve to govern dimensional values of the model specified later. Also known as 'layouts'. |
| Schematic diagrams | System block diagrams containing main system components. |
| Appearance | Data that influences how a part is displayed graphically. |
| View settings | Includes user preferences on how to view the model and feature structure. |
| Layers | Groupings of other data items. Layers can be used to perform group operations on all the entities in the layer, or simply to provide a conceptual grouping of entities into related classes. |
| Reports | Essentially all kinds of data in the system can be arranged in the form of textual reports. |
| Attributes | Comments, annotations, and typed attributes can be attached to almost any of the data classes. Attributes can be attached in a so-called 'persistent' or 'associative' manner, meaning they will stay attached correctly even after regeneration of the model. |
| Administrative data | This data can include the name of the person who originally designed the model, the date of initial design, the history of design changes, locations and names of documentation files, etc. |
| Customization data | Many companies customize their CAD system to conform to local company practices. For example, the default set of features to start the design with, standard views, fonts, libraries of supplier parts, etc. |
| Simplified views | For example, a simplified feature structure that does not contain small features (for more efficient analysis or display); a simplified geometric view containing a smaller number of polygons for efficient rendering; a simplified assembly that does not contain certain complex sub-assemblies, or in which a sub-assembly has been replaced by a simpler representation or geometric envelope. |
| Developer-defined features | Some systems provide capabilities that let independent developers extend the system by implementing their own features. |
| Alternatives | Storing several design alternatives for the same product at the same time is possible. Some product data might be shared by the different alternatives. |

What is claimed is:

1. A computer-implemented method for converting mechanical specification data in a parametric source CAD format from a source CAD system to a parametric target CAD format on a target CAD system said method comprising:
provided a source CAD model comprising said specification data in said source CAD format;
extracting said specification data from said source CAD format;
translating said specification data from said source CAD format to a non-geometric intermediate data structure; and
translating said specification data from said intermediate data structure to said target CAD format, wherein said target CAD format is different than said source CAD format.

2. The method of claim 1 further comprising the steps of: re-translating said specification data from said target CAD format to said source CAD format.

3. The method of claim 1 wherein said specification data comprises format data.

4. The method of claim 1 wherein said specification data comprises history data.

5. The method of claim 1 wherein said specification data comprises family data.

6. The method of claim 1 wherein said specification data comprises data not available through an application program interface ("API") of said source CAD system.

7. The method of claim 11 wherein said specification data comprises feature-based data.

8. The method of claim 1 wherein said extracting step comprises emulating a user via a user interface ("UI") of said source CAD system.

9. The method of claim 14 wherein said extracting step comprises manipulating data represented in windows of said source CAD system.

10. The method of claim 1 wherein said extracting step comprises manipulating files of said source CAD system.

11. The method of claim 1 wherein said generating step comprises emulating a user via a user interface ("UI") of said target CAD system.

12. The method of claim 11 wherein said generating step comprises manipulating windows of said target CAD system.

13. The method of claim 1 wherein said generating step comprises manipulating files of said target CAD system.

14. The method of claim 1 wherein said source CAD format is homeomorphic to said target CAD format.

15. The method of claim 1 wherein said source CAD format is homeomorphic to said intermediate data structure.

16. The method of claim 1 wherein said intermediate data structure is homeomorphic to said target CAD format.

17. The method of claim 1 further comprising the steps of:
identifying an element in said source specification data which is not supported in said target CAD format; and
emulating said element in said target CAD model.

18. An apparatus for converting mechanical specification data in a parametric source CAD format from a source CAD file to a second parametric CAD format in a second CAD file, the apparatus comprising:
a processor including an arithmetic and logic unit;
one or more CAD data memory areas communicatively coupled to said processor and configured to store parametric specification data in said source CAD format and said second CAD format;
an execution memory area communicatively coupled to said processor;
said execution memory area comprising:
an extraction module configured to extract data from said source CAD file; and
a creation module configured to translate said specification data from said source CAD format into ea a non-geometric intermediate CAD format, and to translate said second CAD file in said second format, which is different from said source CAD format, using said intermediate CAD format;
wherein said extraction module and said creation module are configured to be executed by said processor, and at least one finction in said creation module is further executed by said arithmetic and logic unit.

19. The apparatus of claim 18, wherein functions in said creation module are configured to manipulate data represented in windows of a source CAD system.

20. The apparatus of claim 18, wherein functions in said creation module are configured to manipulate files in said source CAD system.

21. The apparatus of claim 19, wherein functions in said creation module are configured to emulate a user via a user interface in said source CAD system.

22. The apparatus of claim 21, wherein functions in said creation module are configured to emulate a user via a user interface in a target CAD system.

23. The apparatus of claim 18, wherein said at least one function validates the integrity of data exchange between said source CAD file and said second CAD file.

* * * * *

UNITED STATES PATENT AND TRADEMARK OFFICE
CERTIFICATE OF CORRECTION

PATENT NO. : 6,614,430 B1  
DATED : September 2, 2003  
INVENTOR(S) : Ari Rappoport It is certified that error appears in the above-identified patent and that said Letters Patent is hereby corrected as shown below:

<u>Column 19,</u>  
Line 4, please delete "claim 11" and insert -- claim 6 --.  
Line 9, please delete "claim 14" and insert -- claim 8 --.

<u>Column 20,</u>  
Line 23, please delete "claim 18" and insert -- claim 19 --.

Signed and Sealed this

Thirteenth Day of April, 2004

JON W. DUDAS  
*Acting Director of the United States Patent and Trademark Office*